United States Patent
Goldstein et al.

(10) Patent No.: US 6,567,465 B2
(45) Date of Patent: May 20, 2003

(54) DSL MODEM UTILIZING LOW DENSITY PARITY CHECK CODES

(75) Inventors: Yuri Goldstein, Southbury, CT (US); Yuri Okunev, Southbury, CT (US); Vitaly Drucker, Stamford, CA (US)

(73) Assignee: PC Tel Inc., Milipitas, CA (US)

( * ) Notice: Subject to any disclaimer, the term of this patent is extended or adjusted under 35 U.S.C. 154(b) by 0 days.

(21) Appl. No.: 09/893,383

(22) Filed: Jun. 27, 2001

(65) Prior Publication Data

US 2002/0181569 A1 Dec. 5, 2002

Related U.S. Application Data

(60) Provisional application No. 60/292,433, filed on May 21, 2001.

(51) Int. Cl.[7] .............................. H04B 1/38; H04L 5/16
(52) U.S. Cl. ...................... 375/222; 375/259; 714/758
(58) Field of Search .............................. 375/222, 259; 714/762, 788, 766, 755, 756, 6, 7, 752, 757, 758, 768, 801, 802, 803, 804, 805

(56) References Cited

U.S. PATENT DOCUMENTS

| | | | | |
|---|---|---|---|---|
| 4,295,218 A | * | 10/1981 | Tanner | 714/762 |
| 4,334,309 A | * | 6/1982 | Bannon et al. | 714/766 |
| 5,872,798 A | * | 2/1999 | Baggen et al. | 714/755 |
| 6,138,125 A | * | 10/2000 | DeMoss | 707/202 |

OTHER PUBLICATIONS

R.G. Gallager, "Low–Density–Parity–Check Codes", MIT Press, Cambridge, MA 1963.

D.J.C. MacKay and R.M. Neal, "Near Shannon limit performance of LDPC codes", Electron. Letters, vol. 32, No. 18, Aug. 1996.

D.J.C. MacKay, "Good Error–Correcting Codes Based on Very Sparse Matrices", IEEE Transactions on Information Theory, vol. 45, No. 2, Mar. 1999.

D.J.C. MacKay, Simon T. Wilson, and Matthew C. Davey, "Comparison of Constructions of Irregular Gallager Codes", IEEE Transactions on Communications, vol. 47, No. 10, Oct. 1999.

Marc P.C. Fossorier, Miodrag Michaljevic, and Hideki Imai, "Reduced Complexity Iterative Decoding of LDPC Codes Based on Belief Propagation", IEEE Transactions on Communications, vol. 47, No. 5, May 1999.

E. Eleftheriou, T. Mittelholzer, and A. Dholakia, "Reduced–complexity decoding algorithm for LDPC codes", Electron. Letter, vol. 37, Jan. 2001.

(List continued on next page.)

*Primary Examiner*—Chi Pham
*Assistant Examiner*—Phuong Phu
(74) *Attorney, Agent, or Firm*—David P. Gordon; David S. Jacobson; Thomas A. Gallagher

(57) ABSTRACT

A DSL modem with a receiver and a transmitter includes an LDPC encoder which utilizes a generation matrix G which is derived from a substantially deterministic H matrix in order to generate redundant parity bits for a block of bits. The H matrix is determined by assigning "ones" of a first column $N_j$ randomly or deterministically. Then, beginning with the second column, assignment of "ones" is carried out deterministically with each "1" in a previous ancestor column generating a "1" in the next descendant column based on the rule that a descendant is placed one position below or above an ancestor. As a result, descending or ascending diagonals are generated. When distributing "ones" in any given column, care is taken to ensure that no rectangles are generated in conjunction with other "ones" in the current column and previous columns. By avoiding generation of rectangles, diagonals are interrupted.

50 Claims, 7 Drawing Sheets

OTHER PUBLICATIONS

IBM Corp., "LDPC codes for G.dmt.bis and G.lit.bis", ITU—Telecommunication Standardization Sector, Document CF–060, Clearwater, Florida, Jan. 8–12, 2001.

Aware, Inc., "LDPC Codes for ADSL", ITU—Telecommunication Standardization Sector, Document BI–068, Bangalore, India, Oct. 23–27, 2000.

IBM Corp., "LDPC codes for DSL transmission", ITU—Telecommunication Standardization Sector, Document BI–095, Bangalore, India, Oct. 23–27, 2000.

IBM Corp., "LDPC coding proposal for G.dmt.bis and G.lite.bis", ITU—Telecommunication Standardization Sector, Document CF–061, Clearwater, Florida, Jan. 8–12, 2001.

IBM Corp., Globespan, "G.gen: G.dmt.bis: G.Lite.bis: Reduced–complexity decoding algorithm for LDPC codes", ITU—Telecommunication Standardization Sector, Document IC–071, Irvine, California, Apr. 9–13, 2001.

* cited by examiner

|    | 1 | 2 | 3 | 4 | 5 | 6 | 7 | 8 | 9 | 10 | 11 | 12 | 13 | 14 | 15 | 16 | 17 | 18 | 19 | 20 |
|----|---|---|---|---|---|---|---|---|---|----|----|----|----|----|----|----|----|----|----|----|
| 1  | 1 | 0 | 0 | 0 | 0 | 1 | 0 | 0 | 0 | 1  | 0  | 0  | 1  | 0  | 0  | 0  | 0  | 0  | 0  | 0  |
| 2  | 0 | 1 | 0 | 0 | 0 | 0 | 1 | 0 | 0 | 0  | 1  | 0  | 0  | 1  | 0  | 0  | 0  | 0  | 0  | 0  |
| 3  | 0 | 0 | 1 | 0 | 0 | 0 | 0 | 1 | 0 | 0  | 0  | 1  | 0  | 0  | 1  | 0  | 0  | 0  | 0  | 0  |
| 4  | 0 | 0 | 0 | 1 | 0 | 0 | 0 | 0 | 1 | 0  | 0  | 0  | 0  | 0  | 0  | 1  | 0  | 0  | 1  | 0  |
| 5  | 0 | 0 | 0 | 0 | 1 | 0 | 0 | 0 | 0 | 1  | 0  | 0  | 0  | 0  | 0  | 0  | 0  | 0  | 0  | 1  |
| 6  | 1 | 0 | 0 | 0 | 0 | 0 | 0 | 0 | 0 | 0  | 1  | 0  | 0  | 0  | 0  | 0  | 0  | 0  | 1  | 1  |
| 7  | 0 | 1 | 0 | 0 | 0 | 0 | 0 | 0 | 0 | 0  | 0  | 1  | 1  | 0  | 0  | 0  | 1  | 0  | 0  | 0  |
| 8  | 0 | 0 | 1 | 0 | 0 | 1 | 0 | 0 | 0 | 0  | 0  | 0  | 0  | 1  | 0  | 0  | 0  | 0  | 1  | 0  |
| 9  | 0 | 0 | 0 | 1 | 0 | 0 | 1 | 0 | 0 | 0  | 0  | 0  | 1  | 0  | 1  | 0  | 0  | 0  | 0  | 0  |
| 10 | 0 | 0 | 0 | 0 | 1 | 0 | 0 | 1 | 0 | 0  | 0  | 0  | 0  | 1  | 0  | 1  | 0  | 0  | 0  | 0  |
| 11 | 1 | 0 | 0 | 0 | 0 | 0 | 0 | 1 | 0 | 0  | 0  | 0  | 0  | 1  | 0  | 1  | 0  | 0  | 0  | 0  |
| 12 | 0 | 1 | 0 | 0 | 0 | 1 | 0 | 0 | 0 | 0  | 0  | 0  | 0  | 0  | 1  | 0  | 1  | 0  | 0  | 0  |
| 13 | 0 | 0 | 1 | 0 | 0 | 0 | 1 | 0 | 1 | 0  | 0  | 0  | 0  | 0  | 0  | 1  | 0  | 0  | 0  | 0  |
| 14 | 0 | 0 | 0 | 1 | 0 | 0 | 0 | 1 | 0 | 0  | 1  | 0  | 0  | 0  | 0  | 0  | 1  | 0  | 0  | 0  |
| 15 | 0 | 0 | 0 | 0 | 1 | 0 | 0 | 0 | 1 | 0  | 0  | 1  | 0  | 0  | 0  | 0  | 0  | 1  | 0  | 0  |

FIG.4a

|    | 1 | 2 | 3 | 4 | 5 | 6 | 7 | 8 | 9 | 10 | 11 | 12 | 13 | 14 | 15 | 16 | 17 | 18 | 19 | 20 |
|----|---|---|---|---|---|---|---|---|---|----|----|----|----|----|----|----|----|----|----|----|
| 1  | 1 | 0 | 0 | 0 | 0 | 0 | 0 | 0 | 0 | 1  | 0  | 0  | 0  | 0  | 0  | 1  | 0  | 0  | 1  | 0  |
| 2  | 0 | 1 | 0 | 0 | 0 | 0 | 0 | 0 | 0 | 0  | 1  | 0  | 0  | 0  | 0  | 0  | 1  | 0  | 0  | 1  |
| 3  | 0 | 0 | 1 | 0 | 0 | 1 | 0 | 0 | 0 | 0  | 0  | 0  | 0  | 0  | 0  | 0  | 0  | 1  | 0  | 1  |
| 4  | 0 | 0 | 0 | 1 | 0 | 0 | 1 | 0 | 1 | 0  | 0  | 0  | 0  | 0  | 0  | 0  | 0  | 0  | 1  | 1  |
| 5  | 0 | 0 | 0 | 0 | 1 | 0 | 0 | 1 | 0 | 0  | 0  | 1  | 0  | 0  | 0  | 0  | 0  | 0  | 1  | 0  |
| 6  | 1 | 0 | 0 | 0 | 0 | 1 | 0 | 0 | 1 | 0  | 0  | 0  | 1  | 0  | 0  | 0  | 0  | 0  | 0  | 0  |
| 7  | 0 | 1 | 0 | 0 | 0 | 0 | 1 | 0 | 0 | 1  | 0  | 0  | 0  | 1  | 0  | 0  | 0  | 0  | 0  | 0  |
| 8  | 0 | 0 | 1 | 0 | 0 | 0 | 0 | 1 | 0 | 0  | 1  | 0  | 0  | 0  | 1  | 0  | 0  | 0  | 0  | 0  |
| 9  | 0 | 0 | 0 | 1 | 0 | 0 | 0 | 0 | 0 | 0  | 0  | 1  | 0  | 0  | 0  | 1  | 0  | 0  | 0  | 0  |
| 10 | 0 | 0 | 0 | 0 | 1 | 0 | 0 | 0 | 0 | 1  | 0  | 0  | 1  | 0  | 0  | 0  | 1  | 0  | 0  | 0  |
| 11 | 1 | 0 | 0 | 0 | 0 | 0 | 0 | 0 | 0 | 0  | 1  | 0  | 0  | 1  | 0  | 0  | 0  | 1  | 0  | 0  |
| 12 | 0 | 1 | 0 | 0 | 0 | 1 | 0 | 0 | 0 | 0  | 0  | 1  | 0  | 0  | 1  | 0  | 0  | 0  | 0  | 0  |
| 13 | 0 | 0 | 1 | 0 | 0 | 0 | 1 | 0 | 0 | 0  | 0  | 0  | 1  | 0  | 0  | 1  | 0  | 0  | 0  | 0  |
| 14 | 0 | 0 | 0 | 1 | 0 | 0 | 0 | 1 | 0 | 0  | 0  | 0  | 0  | 1  | 0  | 0  | 1  | 0  | 0  | 0  |
| 15 | 0 | 0 | 0 | 0 | 1 | 0 | 0 | 0 | 1 | 0  | 0  | 0  | 0  | 0  | 1  | 0  | 0  | 1  | 0  | 0  |

DSL MODEM UTILIZING LOW DENSITY PARITY CHECK CODES

This application claims priority from U.S provisional application SNo. 60/292,433 filed May 21, 2001.

BACKGROUND OF THE INVENTION

1. Field of the Invention

The present invention relates generally to telecommunications. More particularly, the present invention relates to DSL modems utilizing low density parity check (LDPC) codes and methods of simply generating such LDPC codes.

2. State of the Art

LDPC codes were invented by R. Gallager in 1963. R. G. Gallager, "Low-Density-Parity-Check Codes", MIT Press, Cambridge, Mass. 1963. Over thirty years later, a number of researchers showed that LDPC code is a constructive code which allows a system to approach the Shannon limit. See, e.g., D. J. C. MacKay and R. M. Neal, "Near Shannon limit performance of LDPC codes", Electron. Letters, Vol. 32, No. 18, August 1996; D. J. C. MacKay, "Good Error-Correcting Codes Based on Very Sparse Matrices", IEEE Transactions on Information Theory, Vol. 45, No. 2, March 1999; D. J. C. MacKay, Simon T. Wilson, and Matthew C. Davey, "Comparison of Constructions of Irregular Gallager Codes", IEEE Transactions on Communications, Vol. 47, No. 10, October 1999; Marc P. C. Fossorier, Miodrag Michaljevic, and Hideki Imai, "Reduced Complexity Iterative Decoding of LDPC Codes Based on Belief Propagation", IEEE Transactions on Communications, Vol. 47, No. 5, May 1999; E. Eleftheriou, T. Mittelholzer, and A. Dholakia, "Reduced-complexity decoding algorithm for LDPC codes", Electron. Letter, Vol. 37, January 2001. Indeed, these researchers have proved that LDPC code provides the same performance as Turbo-code and provides a range of trade-offs between performance and decoding complexity. As a result, several companies have suggested that LDPC code be used as part of the G.Lite.bis and G.dmt.bis standards. IBM Corp., "LDPC codes for G.dmt.bis and G.lit.bis", ITU-Telecommunication Standardization Sector, Document CF-060, Clearwater, Fla., Jan. 8–12, 2001; Aware, Inc., "LDPC Codes for ADSL", ITU—Telecommunication Standardization Sector, Document BI-068, Bangalore, India, Oct. 23–27, 2000; IBM Corp., "LDPC codes for DSL transmission", ITU—Telecommunication Standardization Sector, Document BI-095, Bangalore, India, Oct. 23–27, 2000; IBM Corp., "LDPC coding proposal for G.dmt.bis and G.lite.bis", ITU—Telecommunication Standardization Sector, Document CF-061, Clearwater, Fla., Jan. 8–12, 2001; IBM Corp., Globespan, "G.gen: G.dmt.bis: G.Lite.bis: Reduced-complexity decoding algorithm for LDPC codes", ITU—Telecommunication Standardization Sector, Document IC-071, Irvine, Calif., Apr. 9–13, 2001.

LDPC code is determined by its check matrix H. Matrix H is used in a transmitter (encoder) for code words generation and in a receiver (decoder) for decoding the received code block. The matrix consists of binary digits 0 and 1 and has size $M_k*M_j$, where $M_k$ is the number of columns, and $M_j$ is the number of rows. Each row in the matrix defines one of the check equations. If a "1" is located in the k-th column of the j'th row, it means that the k-th bit of the code block participates in the j-th check equation.

Matrix H is a "sparse" matrix in that it does not have many "ones". Generally, the matrix contains a fixed number of "ones" N in each column and a fixed number of "ones" $N_k$ in each row. In this case, design parameters should preferably satisfy the equation:

$$M_k*N_j=M_j*N_k \quad (1)$$

Although it is convenient to have equal numbers of "ones" in each column and in each row, this is not an absolute requirement. Some variations of design parameters $N_k$ and $N_j$ are permissible; i.e., $N_k(j)$ and $N_j(k)$ can be functions of j and k, correspondingly. In addition, another important constraint for matrix design is that the matrix should not contain any rectangles with "ones" in the vertices. This property is sometimes called "elimination of cycles with length 4" or "4-cycle elimination". For purposes herein, it will also be called "rectangle elimination".

Generally, there are two approaches in the prior art to designing H matrices. The first approach was that proposed by Gallager in his previously cited seminal work, R. G. Gallager, "Low-Density-Parity-Check Codes", MIT Press, Cambridge, Mass. 1963, and consists of a random distribution of $N_j$ ones within each matrix column. This random distribution is carried out column by column, and each step is accompanied by rectangle elimination within the current column relative to the previous columns. The second approach to H-matrix design is based on a deterministic procedure. For example, in the previously cited IBM Corp., "LDPC codes for G.dmt.bis and G.lit.bis", ITU—Telecommunication Standardization Sector, Document CF-060, Clearwater, Fla., Jan. 8–12 2001, a deterministic H-matrix construction is proposed which includes identity matrices and powers of an initial square permutation matrix.

Both of the prior art approaches to designing H matrices have undesirable characteristics with respect to their implementation in DSL standards. In particular, the random distribution approach of Gallager is not reproducible (as it is random), and thus, the H matrix used by the transmitting modem must be conveyed to the receiving modem. Because the H matrix is typically a very large matrix, the transfer of this information is undesirable. On the other hand, while the deterministic matrix of IBM is reproducible, it is extremely complex and difficult to generate. Thus, considerable processing power must be dedicated to generating such a matrix, thereby adding complexity and cost to the DSL modem. Besides, this approach does not allow constructing a matrix with arbitrary design parameters $M_k$ and $M_j$.

SUMMARY OF THE INVENTION

It is therefore an object of the invention to provide simple methods of generating reproducible H matrices.

It is another object of the invention to provide DSL modems which utilize simply generated reproducible H matrices.

In accord with these objects which will be discussed in detail below, the DSL modem of the invention generally includes a receiver and a transmitter with the transmitter including a substantially deterministic LDPC encoder. The encoder is a function of a substantially deterministic H matrix (H=A|B) which is determined according to the steps and rules set forth below. More particularly, the encoder takes a block of bits and utilizes a generation matrix $G=A^{-1}B$ which is derived from (i.e., is a function of) the H matrix in order to generate redundant parity bits. The redundant bits are appended to the original block of bits to generate a word.

The substantially deterministic H matrix is determined as follows. First, the "ones" of a first column N are assigned randomly or deterministically. Preferably, the ones are distributed evenly within the first column with the first "1" in the first row of the first column according to the algorithm:

$$H(r,1)=1, \text{ where } r=1+(i-1)*\text{integer } (M_j/N_j); i=1,2,\ldots N_j \quad (2)$$

Then, beginning with the second column, assignment of "ones" is carried out deterministically with each "1" in a previous (ancestor) column generating a "1" in the next (descendant) column based on the rule that a descendant is placed one position below or one position above an ancestor (it being determined in advance by convention whether the position below is used or the position above is used). As a result, a descending diagonal or an ascending diagonal is generated. Where a descending diagonal is used and the ancestor is in the lowest row of the matrix, the descendant may take any position in the next column, although it is preferable to place the descendant in the highest free position.

When distributing "ones" in any given column, each new descendant should be checked to ensure that no rectangles are generated in conjunction with other "ones" in the current column and previous columns. If a rectangle is generated, the location of the descendant is changed, preferably by shifting the location down or up (by convention) one position at a time until the descendant is in a position where no rectangle is generated. If the position is shifted down and the lowest position is reached without finding a suitable position, the search is continued by shifting the location one position up from the initial descendant position until a suitable position is found.

According to the invention, the descendants may be generated in any given order. Two preferable generation orders correspond to increasing or decreasing ancestor positions in the column. For example, descendants may be generated by first generating a descendant for the ancestor at the bottom of the matrix, then by generating a descendant for the ancestor above that in the column, then by generating a descendant for the ancestor above that one, etc. (also called herein "bottom-up"); or by first generating a descendent for the ancestor at the top of the matrix, then by generating a descendant for the ancestor below that in the column, then by generating a descendant for the ancestor below that one, etc. (also called herein "top-down").

When generating descendants it is possible that one or more descendants can "disappear" because of the lack of free positions satisfying the rectangle elimination criterium. To regenerate the "lost descendant", it is generally sufficient to change the order of descendant generation for that column. Thus, if the order of descendant generation was conducted "bottom-up", the direction of generation is switched to "top-down" and vice versa; preferably for that column only. If changing the order of descendant generation in a column does not cause a free position to appear, the descendant disappears for that column.

When a descendant disappears it is desirable in the next column to provide a new descendant which does not have an ancestor. In this case, a search of an acceptable position for an "ancestor-less" descendant is conducted, preferably from the first row down.

Additional objects and advantages of the invention will become apparent to those skilled in the art upon reference to the detailed description taken in conjunction with the provided figures.

BRIEF DESCRIPTION OF THE DRAWINGS

FIG. 4a is an H matrix of size 20×15 generated using bottom-up descendant generation.

FIG. 4b is an H matrix of size 20×15 generated using top-down descendant generation.

DETAILED DESCRIPTION OF THE PREFERRED EMBODIMENTS

Figure 1:
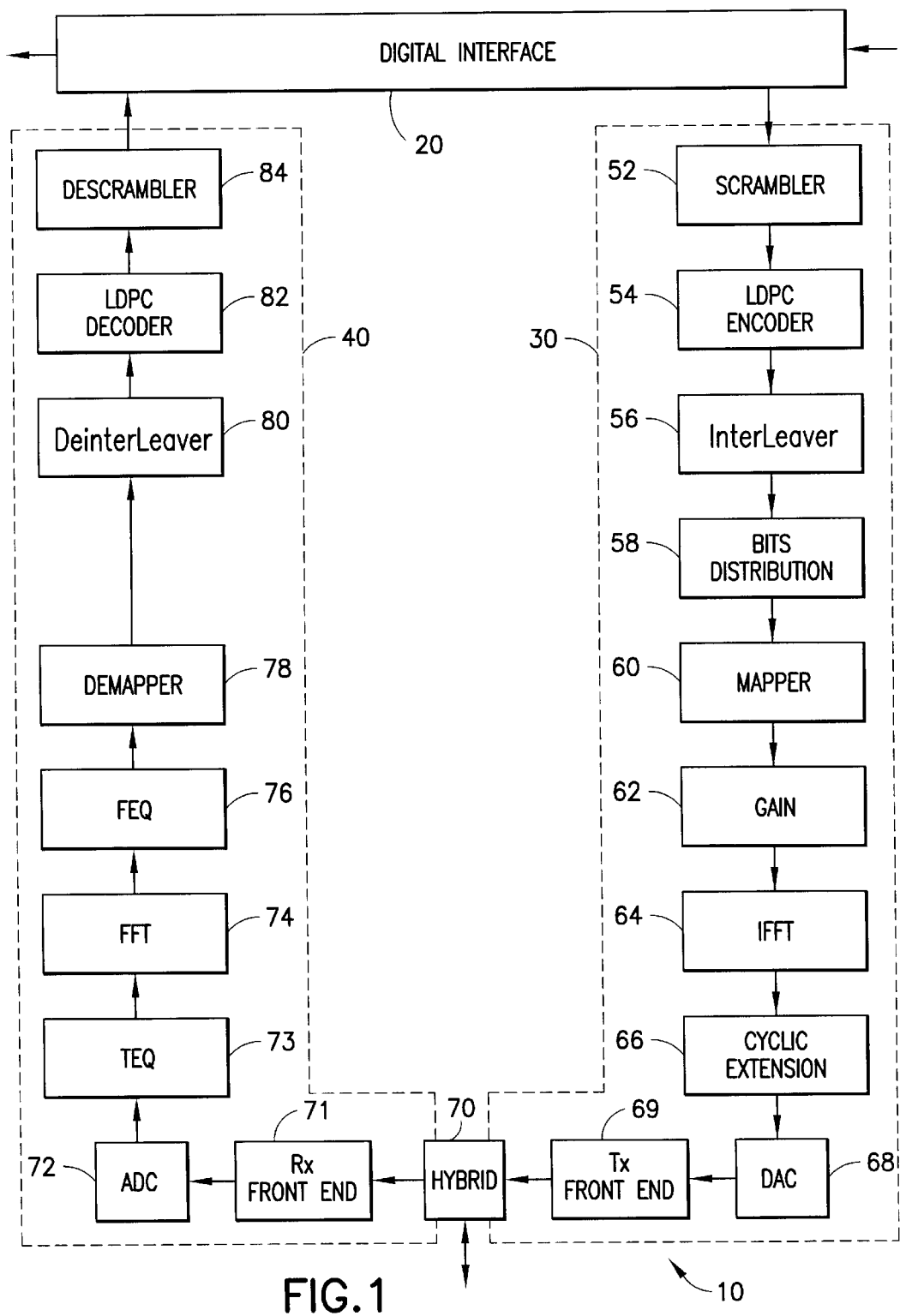
FIG. 1 is a high level block diagram of a DSL modem utilizing LDPC encoding and decoding according to the invention.

Turning to FIG. 1, a high level block diagram of a DSL modem 10 is seen. The modem 10 preferably includes a digital interface 20, a transmitter section 30 and a receiver section 40. The transmitter section preferably includes a scrambler 52 which receives data from the digital interface 20, a LDPC encoder 54, an interleaver 56, a bit distributor 58, a mapper 60, a gain element 62, an infinite fast Fourier transform block (IFFT) 64, a cyclic extension block 66, a digital to analog converter 68 and a front end transmit block 69 which interfaces with a hybrid 70. The receiver section preferably includes a front end receive block 71 which interfaces with the hybrid 70, an analog to digital converter 72, a time equalizer (TEQ) 73, a fast Fourier transform block (FFT) 74, a frequency equalizer (FEQ) 76, a demapper 78, a deinterleaver 80, a LDPC decoder 82, and a descrambler 84 which provides data to the digital interface 20. Other than the details of the LDPC encoder 54 (and decoder 82), the modem 10 is substantially as would be understood by those skilled in the art. In addition, it will be appreciated by those skilled in the art that the modem 10 may be implemented in hardware, software, or a combination thereof.

Figure 2:
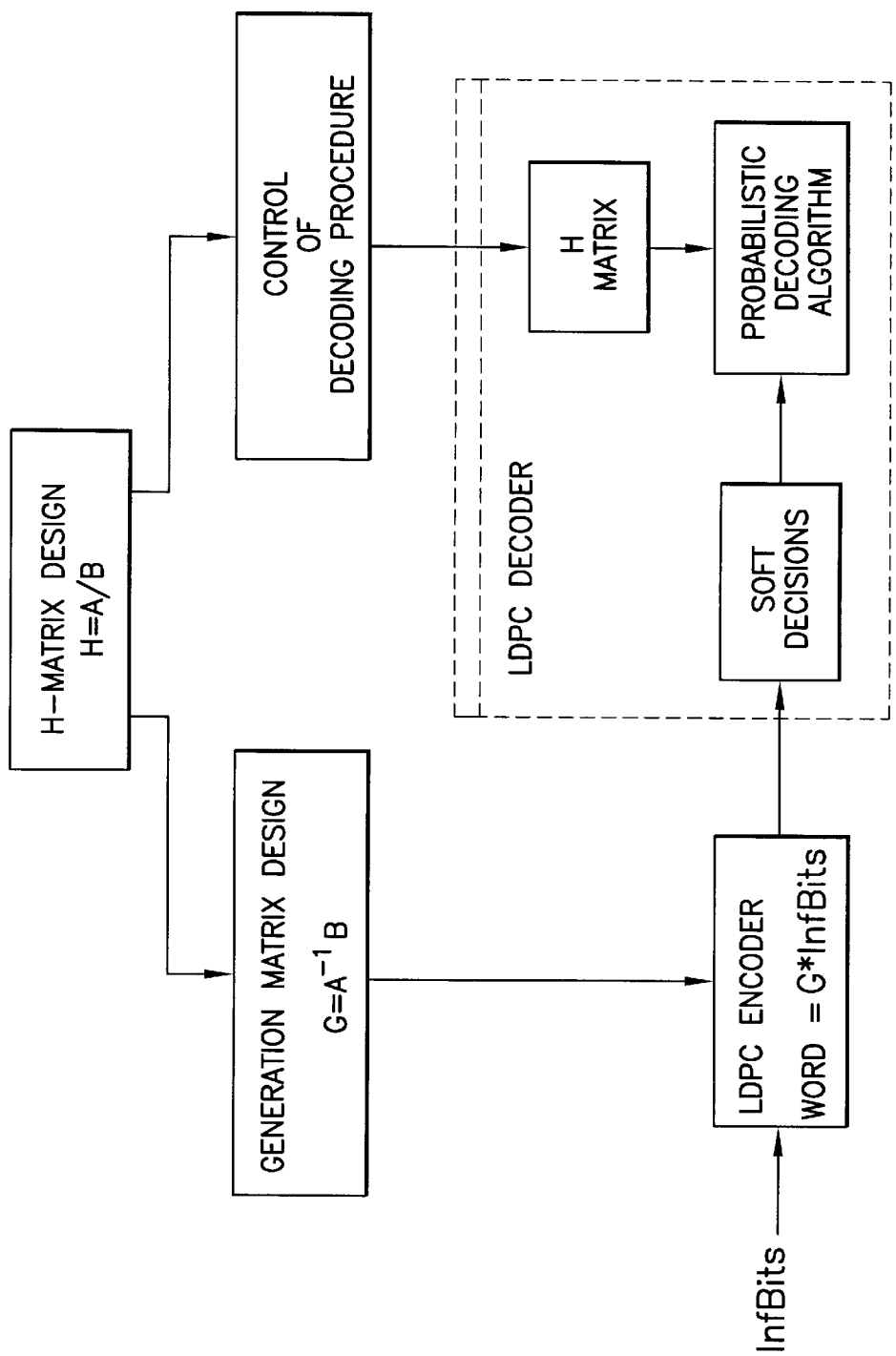
FIG. 2 is a high level flow diagram of a manner of using an H matrix in the DSL modem of FIG. 1.

High level details of the LDPC coder 54 and decoder 82 are seen in FIG. 2. In particular, the LDPC coder 54 and decoder 82 utilize an H matrix which is designed according to the steps and rules set forth below. The H matrix, where H=A|B, with A being a square matrix and B being the remaining matrix rectangle, is used for encoding purposes to generate a generation matrix G. Matrix G is defined by G=A$^{-1}$B, which results from multiplying the inverse of the square A matrix with the rectangular B matrix. The LDPC encoder 54 uses the G matrix and a block of bits received from the scrambler 52 to generate a set of parity bits (also called redundant bits). The parity bits are appended to the block of bits received from the scrambler 52 to generate a word which is forwarded to the interleaver 54 and further processed. If desired, and as suggested by FIG. 2, rather than appending the redundant bits to the block of data, the G matrix may include an "identity matrix" portion so that a multiplication of the G matrix and the block of bits directly provides the resulting word.

The H matrix is likewise used on the decoding side. In particular, deinterleaved words received by the LDPC decoder are subjected to soft decisions (as is known in the art), and then subjected to probabilistic decoding which requires information of the H matrix which was utilized to generate the parity bits.

The H matrix (and G matrix) may be generated by a microprocessor (not shown) and software which may also be used to implement one or more additional elements of the transmitter or receiver of the modem 10. Alternatively, the H matrix (and G matrix) may be implemented in other hardware and/or software in the modem 10. Technically, only the G matrix needs to be available for the transmitter (encoding), while only the H matrix is needed for the receiver (decoding).

Figure 3:
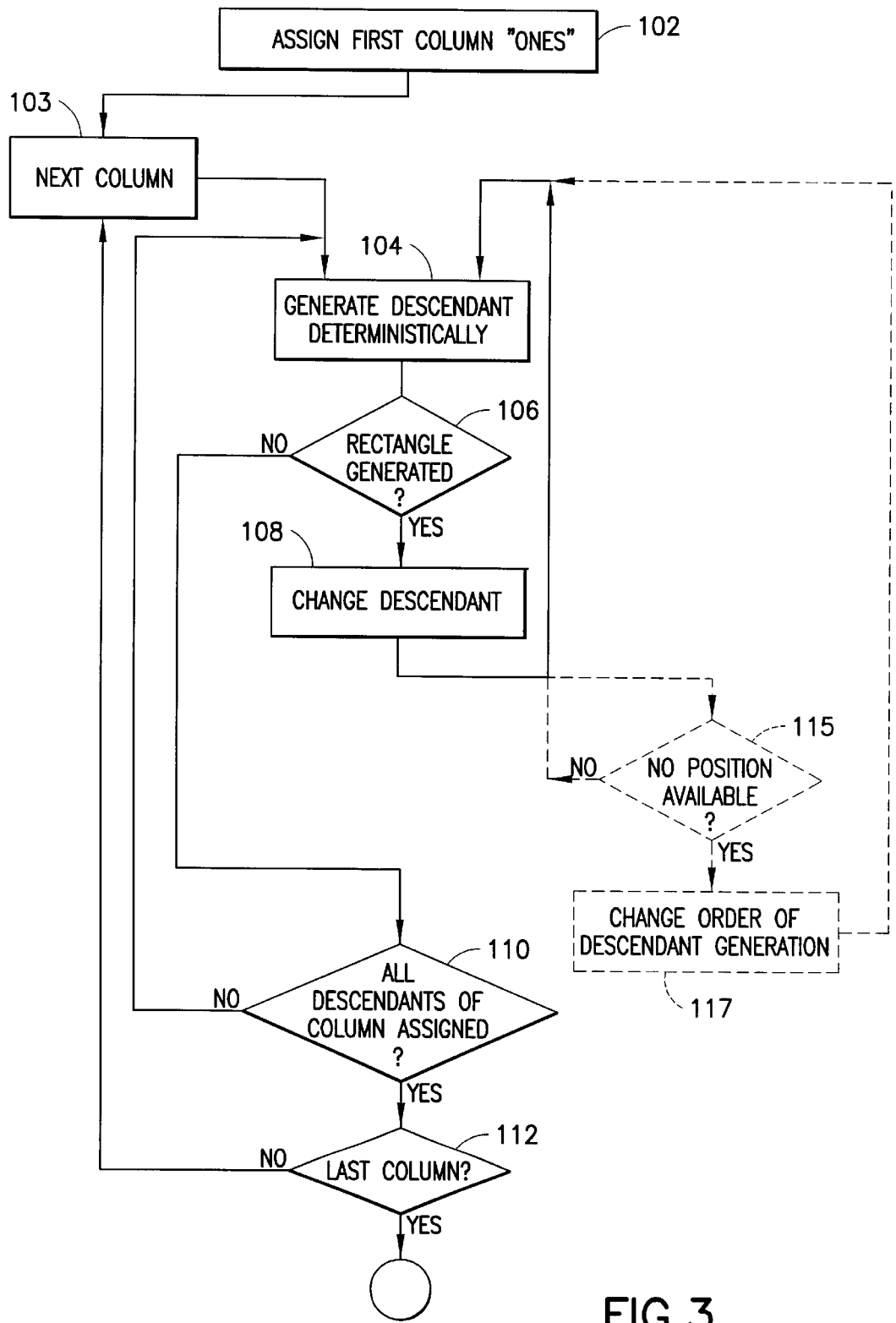
FIG. 3 is a flow chart of a preferred method of generating an H matrix according to the invention.

According to the invention, the H matrix is a substantially deterministic matrix which, according to a first embodiment, may be determined according to the steps of FIG. 3. First, at step 102 the "ones" of a first column $N_j$ are assigned randomly or deterministically. Preferably, the "ones" are distributed evenly within the first column with the first "1" in the first row of the first column according to relationship (2) set forth above:

$$H(r,1)=1, \text{ where } r=1+(i-1)*\text{integer } (M_j/N_j); i=1,2,\ldots N_j$$

where $M_j$ is the number of rows in the matrix and $N_j$ is the number of "ones" in the column. Thus, if the "ones" are assigned deterministically, the first "one" is located at H(1,1) and the remainder of "ones" for the column are evenly distributed in the column. If, on the other hand, the "ones" are assigned randomly, preferably, a "one" is located in a random row of column 1, and the remaining "ones" are evenly distributed. While less preferred, all "ones" in column one can be randomly located.

Returning to FIG. 3, once the "ones" of the first column are assigned, at 103 the next column is addressed. In particular, at 104, each of the "ones" of the next column is generated deterministically (i.e., according to a predetermined set of rules). In particular, a "one" of the second column (called a "descendant") is generated at 104 by placing the descendant "1" one position below or one position above its "ancestor" "one" of the previous column (it being determined in advance by convention whether the position below is used or the position above is used). As a result, a descending diagonal or an ascending diagonal is generated. Where a descending diagonal is used and the ancestor is in the lowest row of the matrix, the descendant may take any position in the next column, although it is preferable to place the descendant in the highest free position. This may be seen with reference to columns 5 and 6 of FIG. 4b. As seen in FIG. 4b, H(15,5)=1, and accordingly, the descendant is found in the first row of column 6; i.e., H(1,6)=1. Similarly H(15,9) generates H(1,10), and H(15, 12) generates H(1,13). Conversely, where an ascending diagonal is used and the ancestor is in the highest row of the matrix, the descendant may take may position in the next column, although it is preferable to place the descendant in the lowest free position.

When distributing "ones" in any given column, at 106, each new descendant is checked to ensure that no rectangles are generated in conjunction with other "ones" in the current column and previous columns. If a rectangle is generated, a command to change the location of the descendant is issued at 108, preferably by shifting the location down or up (by convention) one position at a time (at 104) until the descendant is in a position where no rectangle is generated (as determined at 106). If the position is shifted down and the lowest position is reached without finding a suitable position, the search is continued by shifting the location one position up from the initial descendant position until a suitable position is found.

Rectangle elimination is seen in the matrix of FIG. 4a. In particular, referring to the fifth and sixth columns, according to the rule of descendants, ancestor H(5,5)=1 should generate a descendant H(6,6)=1. However, this descendant would cause a rectangle to appear in conjunction with H(1,6), H(1,1), and H(6,1). Going down in column 6, it is seen that position H(7,6) is also not acceptable as it would cause a rectangle to appear in conjunction with H(7,2), H(12,2) and H(12,6). Thus, the descendant of H(5,5) is found in position H(8,6).

According to the invention, the descendants may be generated in any given order. Two preferable generation orders correspond to increasing or decreasing ancestor positions in the column. For example, descendants may be generated by first generating a descendant for the ancestor at the bottom of the matrix, then by generating a descendant for the ancestor above that in the column, then by generating a descendant for the ancestor above that one, etc. (also called herein "bottom-up"). The bottom-up technique is seen in FIG. 4a, where a descendant is generated first for H(15,5), then for ancestor H(10,5), and finally for ancestor H(5,5). Alternatively, descendants may generated by first generating a descendent for the ancestor at the top of the matrix, then by generating a descendant for the ancestor below that in the column, then by generating a descendant for the ancestor below that one, etc. (also called herein "top-down"). The top-down technique generates a full diagonal of "ones" from H(1,1) to H($M_j$,$M_j$) as is seen in FIG. 4b. In FIG. 4b, a descendant is generated first for H(5,5), then for ancestor H(10,5), and finally for ancestor H(15,5). Regardless of whether the top-down or bottom-up technique is used, at 110, a determination is made as to whether all descendants for a column have assigned. If all descendants for the column have not been assigned, the program cycles through steps 104–110. If all descendants for the column have been assigned, unless a determination is made at 112 that the column is the last column, the next column is accessed at 103 for placement of descendant "ones".

When generating descendants it is possible that one or more descendants can "disappear" because of the lack of free positions satisfying the rectangle elimination criterium. This determination can be made at step 115 (shown in phantom after step 108). To regenerate the "lost descendant", it is generally sufficient to change the order of descendant generation for that column (step 117—shown in phantom). Thus, if the order of descendant generation was conducted "bottom-up", the direction of generation is switched to "top-down" and vice versa. Preferably, the order of descendant generation is changed only for that column. If changing the order of descendant generation in a column does not cause a free position to appear, the descendant disappears for that column.

When one or more descendants disappear in a column, it is desirable in the next column to provide a new descendant for each descendant which does not have an ancestor. In this case, a search of acceptable positions for each "ancestorless" descendant is conducted, preferably from the first row down.

Generally, as set forth above, the number of "ones" in each column $N_j$ is determined by the number of "ones" in the previous column, because a descendant is generated for each ancestor. In the preferred embodiment of the invention, this number is fixed and defined as a design parameter. On the other hand, the number of "ones" in each row (row weight) is preferably limited to a maximum row weight (Max($N_k$)) which is also a design parameter. Thus, if during distribution of "ones" within a particular column, the number of "ones" in some row reaches Max($N_k$), "ones" should not be inserted in that row (i.e., the remaining part of the row is automatically filled with "zeros"), and the descendant "one" is moved by shifting the location of the descendant one position down or up (by convention).

An implementation in Matlab of the method of H matrix design according to FIG. 3 as described above is as follows:

```
Check-Matrix initialization
Mk=input ('number of matrix columns, code block length        Mk=     ');
Nj=input ('number of "ones" in a column, number of checks for bit   Nj=     ');
Nk=input ('number of "ones" in a row, number of bits in each check   Nk=     ');
Mj=input ('number of matrix rows, number of check equations        Mj=     ');
C= [];                              % Check-Matrix
wa [0 2= (ones(size (1: (Mk−1))))] ;
for j=1;Mj
      C= [C;w] ;
end
vNk=zeros (size (1:Mj)) ;           % current numbers of "ones" in rows
vNj=zeros (size (1:Mk)) ;           % current numbers of "ones" in columns
1-st column initialization
rr=floor (Mj/Nj) ;
for jr=1:Nj                         % evenly distributed ones
      r=1 + (jr−1) *rr;
      C (r, 1) =1 ;
      vNk (r) =1 ;
end
vNj (1) =Nj ;
Matrix Design
for k=1: (Mk−1)                     % column by column "1" assignment
z=C (:, (k+1)) ;
for h=1:2                           %h=1:search, beginning from the last row
if h==1
count=0; counth1=0 ;                % current number of "ones" in the column
for jj=1:Mj                         % row by row assignment, beginning from Mj
x=0 ;
j=Mj+1−jj ;
if j==Mj & C(Mj,k)==1               % transfer "1" from last row to 1-st row
n=0; nn=0 ;
while nn==0 & n<Mj
n=n+1 ;
if C(n, (k+1))==2
C(n, (k+1))=1 ;
nn=1: counth1=counth1+1 ;
end
end
x=n ;
elseif C(j,k)==1 & C((j+1), (k+1))==2     % typical diagonal shift
C((j+1), (k+1))=1 ;
x=j+1 ;
counth1=counth1+1 ;
elseif C(j,k)==1 & C((j+1), (k+1)) <2     % additional shift
m=0; nn=0 ;
while nn==0 & m<(Mj+1)              % searching the acceptable place
m=m+1 ;
if (j+1+m) < (Mj+1)                 % searching down
nm=m;
elseif (j+1+m) >Mj                  % searching up
nm=Mj−j−1−m;
end
if C(j+1+nm, (k+1))==2
C(j+1+nm, (k+1))=1;
nn=1; counth1=counth1+1;
end
end
x=j+1+nm;
end
if x>0                              % rectangle elimination
count=count+1 ;
kk=k;
while kk>0
if C(x,kk)==1
for jj=1:Mj
if (C(jj,kk)==1) & (abs(jj−x) >0) & (count<Nj)
C (jj, (k+1))=0;
end
end
end
kk=kk−1;
end
end
end                                 % for jj=1:Mj (end of one column design for h=1)
elseif h==2 & counth1<Nj
count=0; counth2=0;
for jj=1:Mj                         % row by row "1" assignment from 1-st row
x=0;
j=jj;
```

-continued

```
if j==Mj & C(Mj,k)==1          % transfer "1" from last row to 1-st row
n=0;nn=0;
while nn==0 & n<Mj
n=n+1;
if z (n) ==2
z (n) =1;
nn=1;
counth2=counth2+1;
end
end
x=n;
elseif C(j,k)==1 & z(j+1)==2
z (j+1) =1;
x=j+1;
counth2=counth2+1;
elseif C(j,k)==1 & z(j+1) <2
m=0;nn=0;
while nn==0 & m<(Mj-1)         % searching the acceptable place
m=m+1;
if (j+1+m) < (Mj+1)            % searching down
nm=m;
elseif (j+1+m) >Mj             % searching up
nm=Mj-j-1-m;
end
if z(j+1+nm)==2
z (j+1+nm)=1;
nn=1;
counth2=counth2+1;
end
end
x=j+1+nm;
end
if x>0                         % rectangle elimination
count=count+1;
kk=k;
while kk>0
if C(x,kk)==1
for jj=1:Mj
if (C(jj,kk)==1) & (abs(jj-x)>0) & (count<Nj)
z(jj)=0;
end
end
end
kk=kk-1;
end
end
end                            % for jj=1:Mj (end of one column design for h=2)
if counth2>counth1
C(: , (k+1))=z;
end
end                            % if h==1
end                            % for h=1:2
if vNj (k) <Nj                 % ancestor recreation
qq=0; f=0;
while f<1 & qq<Mj
qq=qq+1
if C(qq, (k+1))==2
C(qq, (k+1))=1;
f=f+1
end
end
end
for jj=1:Mj
if C(jj, (k+1))==1
vNk (jj)=vNk (jj)+1;           % calculation of ones in each row
vNj (k+1)=vNj (k+1) +1;        % calculation of ones in each column
else
C (jj, (k+1))=0;               % change "2" to "0" in columns
end
if vNk(jj)==Nk
for kk=(k+2) :Mk               % change "2" to "0' in rows
C (jj ,kk)=0;
end
end
end
end                            % for k=1: (Mk-1) (end of columns design)
```

-continued

```
C;                  % demo:Check Matrix
vNj                 % demo:Number of ones in columns
vNk                 % demo:Number of ones in rows
```

It will be appreciated by those skilled in the art that other implementations of generating an H matrix design in Matlab or in other software or hardware are easily obtained.

Figure 5:
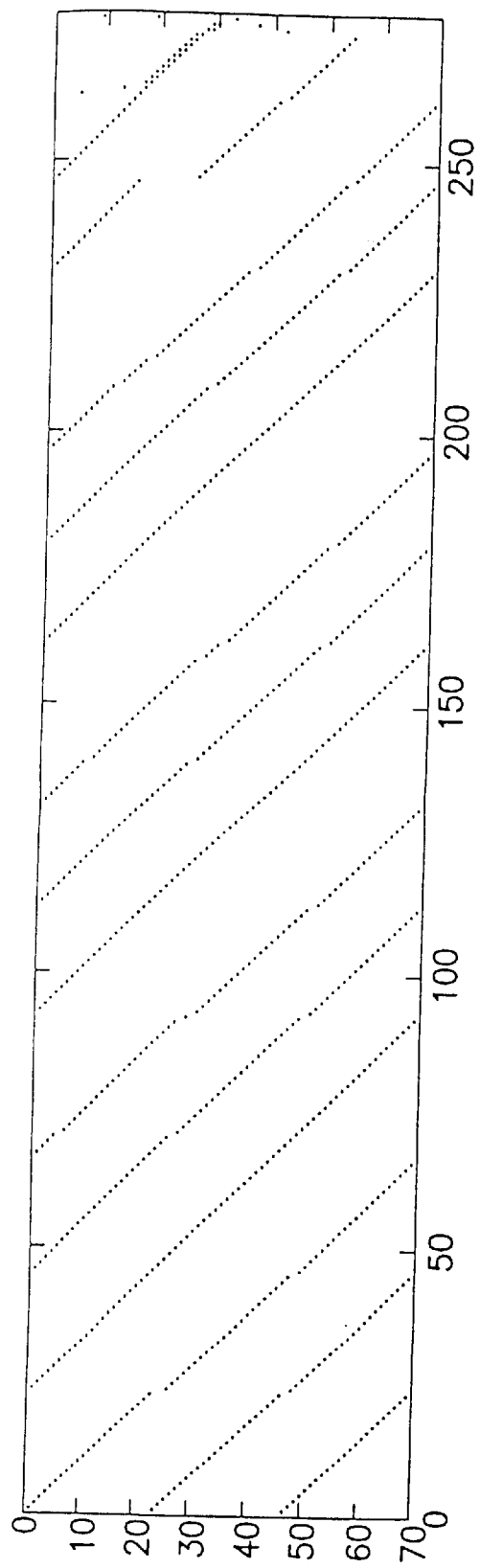
FIG. 5 is an H matrix of size 276×69 generated using bottom-up descendant generation.
Figure 6:
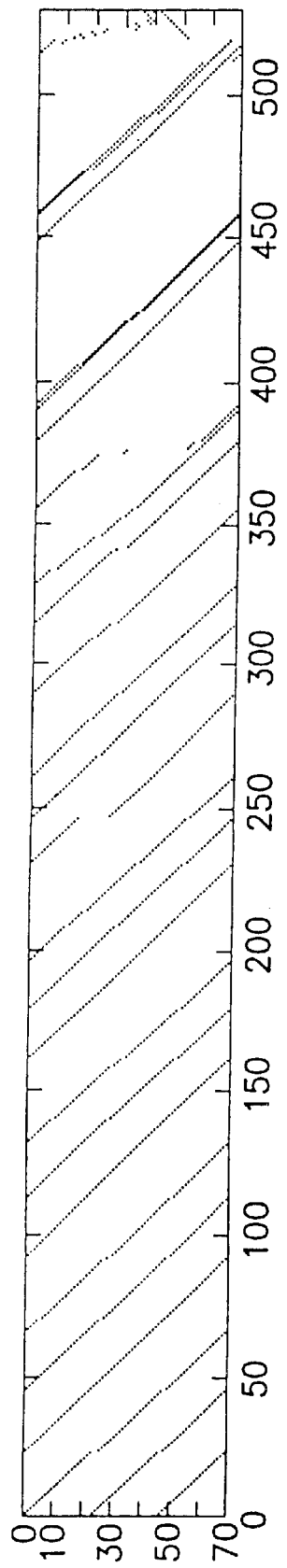
FIG. 6 is an H matrix of size 529×69 generated using bottom-up descendant generation

FIG. 5 is an H matrix of size 276×69 generated using bottom-up descendant generation as set forth in the previously listed Matlab program. The H matrix of FIG. 5 has design parameters $M_k=276$, $M_j=69$, $N_k=12$, $N_j=3$. The generated H matrix contains a fixed number of "ones" in columns $N_j=3$, and a fixed number of "ones" in rows $N_k=12$. Similarly, FIG. 6 is an H matrix of size 529×69 generated using the previously listed Matlab program. The H matrix of FIG. 6 has the design parameters $M_k=529$, $M_j=69$, $Max(N_k)=12$, $N_{j=3}$. This H matrix contains a fixed number of "ones" in its columns, $N_j=3$; and a nonfixed, but limited number of "ones" in its rows, $20<N_k<25$. In FIGS. 5 and 6, a "one" is shown by a dot, while a "zero" is shown by the absence of a dot.

Figure 7A:
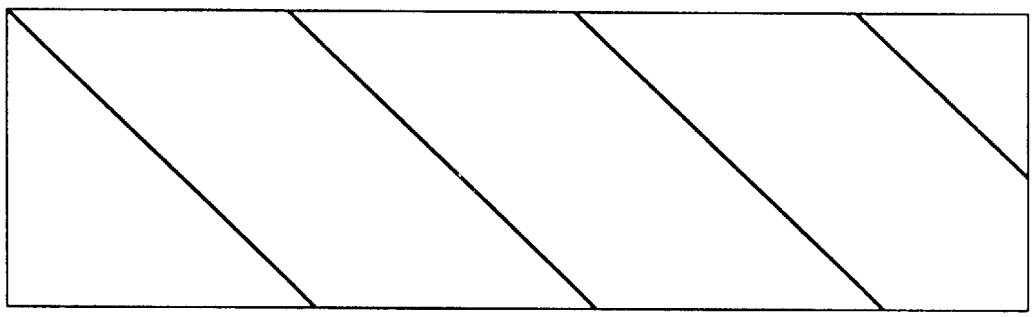
FIGS. 7a–7c are examples of initialization values for the H-matrix according to a second embodiment of the invention.
Figure 7B:
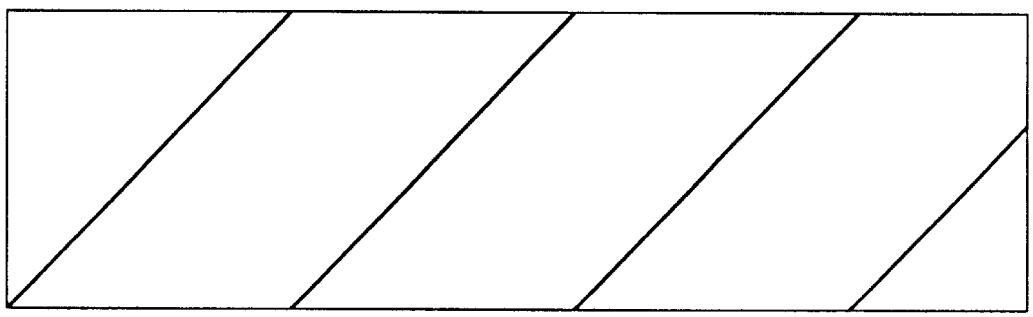
Figure 7C:
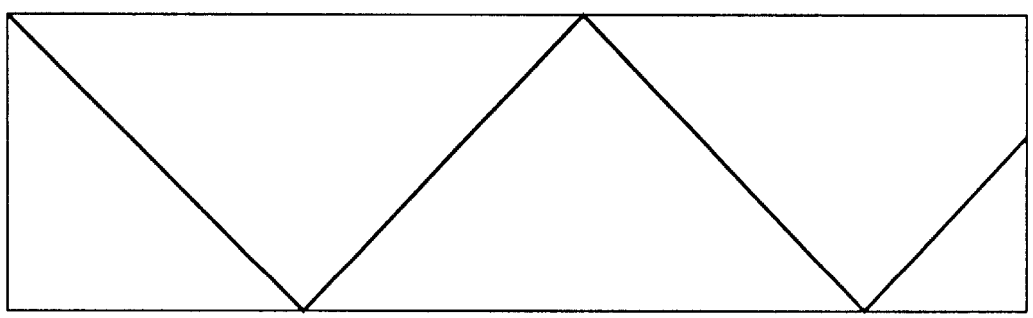

According to a second embodiment of the invention, the design procedure for generating the H matrix may be simplified. In particular, because every column should contain at least one "1", it is possible to initialize the H matrix with an effectively continuous diagonal. Three such diagonals are shown in FIGS. 7a–7c, with FIG. 7a representing a descending diagonal, FIG. 7b representing an ascending diagonal, and FIG. 7c representing a mixed descending-ascending diagonal. Of course, an ascending-descending diagonal (not shown) could likewise be utilized. With the H matrix initialized as shown, the steps shown in FIG. 3 are carried out only with respect to the "ones" which are distributed in the first column and their descendants, thereby reducing the number of calculations required.

With the substantially deterministic method of generating H matrices set forth above, it will be appreciated that if standard conventions (e.g., deterministic first column, descending diagonal generation, bottom-up descendant generation) are agreed upon for all modems, the only information which must be transferred from a transmitting modem to a receiving modem regarding the H matrix includes the matrix size ($M_k \times M_j$), and the number (or maximum thereof) of "ones" in a row or column; $N_k$ and $N_j$. If standard conventions are not used, code representing one or more of: whether descending or ascending diagonals are used, whether bottom-up or top-down descendant generation is used, the basis of the first column, etc. will also be required to be sent from the transmitting modem to the receiving modem. Regardless, the generation of the H matrix (and hence the G matrix) will be greatly simplified in both the transmitter and receiver.

There have been described and illustrated herein embodiments of modems utilizing LDPC coders based on particular H matrices, and methods of simply generating such H matrices. While particular embodiments of the invention have been described, it is not intended that the invention be limited thereto, as it is intended that the invention be as broad in scope as the art will allow and that the specification be read likewise. Thus, while particular code has been listed for generating H matrices, it will be appreciated that other software and/or hardware could be utilized. Also, while the H matrix was discussed with reference to a particular DSL-type modem, it will be appreciated that the H matrix could be used in other types of modem or in other applications. Further, while particular preferred conventions were described, it will be appreciated that other conventions could be added or substituted. For example, while a "bottom-up" and a "top-down" convention were described, a "middle-out" convention could be utilized. Similarly, while the convention of causing the descendant to be located in a row one position down or up from the ancestor of the previous column is preferred, a diagonal can be likewise generated by causing the descendant to be located two, three or n rows up or down from the ancestor of the previous column. In addition, the convention utilized to generate the descendants could change, by convention, from column to column. Furthermore, while rectangle elimination is shown in FIG. 3 to be conducted upon placement of each "1" value in the matrix, it will be appreciated that no checking is required for the first few columns which in principle cannot create a rectangle. Also, while FIG. 3 represents checking for rectangle elimination after each placement of a "1", it is equivalently possible (and is in fact shown in the Matlab program described above) to determine in advance for each column, into which rows a "1" value cannot be placed due to the rectangle rule. Thus, many equivalent flow charts such as FIG. 3 may be generated which represent methods of generating an H matrix according to the invention. Further yet, while the invention was described as generating a matrix by inserting "1" values into a first column of the matrix and assigning descendant ones in subsequent columns, it will be appreciated that the "1" values could be inserted from left to right, or from right to left in the matrix, and the first column to received the ones could be any column of the matrix. Where, a middle column is selected as the first column to receive the ones, the first and last columns will be perceived to be adjacent each other for purposes of continuing the assignment of descendant ones. It will therefore be appreciated by those skilled in the art that yet other modifications could be made to the provided invention without deviating from its spirit and scope as so claimed.

What is claimed is:

1. A digital subscriber line (DSL) modem, comprising:

a) a digital interface; and b) a transmitter coupled to said digital interface, said transmitter including a low density parity check (LDPC) encoder which generates redundant bits utilizing a generation matrix which is a function of a substantially deterministically generated H matrix;

c) a receiver coupled to said digital interface, said receiver including a LDPC decoder; and d) means for substantially deterministically generating said H matrix, said H matrix having a plurality of columns ($M_k$) and a plurality of rows ($M_j$), said means for generating said H matrix being associated with at least one of said transmitter and said receiver and including means for assigning a plurality of "ones" into a first column of said H matrix, means for deterministically assigning descendant "ones" in adjacent columns in a substantially diagonal fashion based on the assignment of ancestor "ones" in said first column, and means for preventing "ones" from being located in locations which would cause a rectangle pattern of "ones" in said H matrix by causing a descendant "one" which would otherwise be located in one of said locations to assume another location, thereby causing breaks in diagonal patterns of "ones".

2. A modem according to claim 1, wherein:

said first column of the H matrix is a left-most column of said matrix.

3. A modem according to claim 1, wherein:

said adjacent columns are subsequent columns.

4. A modem according to claim 1, wherein:

said means for generating an H matrix assigns "ones" into said first column in a random fashion.

5. A modem according to claim 1, wherein:

said means for generating an H matrix assigns "ones" into said first column in a deterministic fashion.

6. A modem according to claim 1, wherein:

said means for generating an H matrix assigns "ones" into said first column such that said "ones" are distributed evenly within said first column.

7. A modem according to claim 1, wherein:

said means for generating an H matrix assigns "ones" into said first column according to $$H(r,1)=1, \text{ where } r=1+(i-1)*\text{integer } (M_j/N_j); i=1,2,\ldots N_j$$

where $M_j$ is the number of rows in said H matrix, and $N_j$ is the number of "ones" in a column of said H matrix.

8. A modem according to claim 1, wherein:

said means for deterministically assigning descendant "ones" in adjacent columns locates a descendant one position below an ancestor unless locating said descendant in that position which would cause a rectangle pattern of "ones" in said H matrix.

9. A modem according to claim 8, wherein:

when an ancestor in a particular column is located at a last row of said H matrix, said means for deterministically assigning descendant "ones" locates a descendant for that ancestor in any row of the next column which would not cause a rectangle pattern of "ones" in said H matrix.

10. A modem according to claim 9, wherein:

said any row of the next column is the highest row possible without causing a rectangle pattern of "ones" in said H matrix.

11. A modem according to claim 1, wherein:

said means for deterministically assigning descendant "ones" in adjacent columns locates a descendant one position above an ancestor unless locating said descendant in that position which would cause a rectangle pattern of "ones" in said H matrix.

12. A modem according to claim 11, wherein:

when an ancestor in a particular column is located at a first row of said H matrix, said means for deterministically assigning descendant "ones" locates a descendant for that ancestor in any row of the next column which would not cause a rectangle pattern of "ones" in said H matrix.

13. A modem according to claim 1, wherein:

said means for preventing "ones" from being located in locations which would cause a rectangle pattern of "ones" in said H matrix comprises means for shifting the location of a "one" by one position at a time until the descendant is in a position where no rectangle is generated.

14. A modem according to claim 13, wherein:

said means for preventing shifts the location down by one position at a time.

15. A modem according to claim 14, wherein:

if a lowest row is reached and still does not present a suitable location for the descendant, said means for preventing shifts the location up by one position at a time.

16. A modem according to claim 13, wherein:

said means for preventing shifts the location up by one position at a time.

17. A modem according to claim 16, wherein:

if a highest row is reached and still does not present a suitable location for the descendant, said means for preventing shifts the location down by one position at a time.

18. A modem according to claim 1, wherein:

said means for deterministically assigning descendant "ones" in adjacent columns in a substantially diagonal fashion based on the assignment of ancestor "ones" in said first column generates descendants in a bottom-up manner such that said means for deterministically assigning descendant "ones" first generates a descendant for a particular ancestor located in the lowest row of said first column containing an ancestor, and then generates a descendant for the ancestor above that particular ancestor.

19. A modem according to claim 18, wherein:

said means for deterministically assigning descendant "ones" switches from generating descendants in said bottom-up manner to generating descendants in a top-down manner if said means for preventing would otherwise prevent a descendant from being located in any location due to a rectangle pattern of "ones" appearing in said H matrix.

20. A modem according to claim 19, wherein:

said means for deterministically assigning descendant "ones" generates an ancestor-less descendant in a column adjacent a column where a descendant disappears because it cannot be located by said means for deterministically assigning descendant "ones" because of said means for preventing.

21. A modem according to claim 1, wherein:

said means for deterministically assigning descendant "ones" in adjacent columns in a substantially diagonal fashion based on the assignment of ancestor "ones" in said first column generates descendants in a top-down manner such that said means for deterministically assigning descendant "ones" first generates a descendant for a particular ancestor located in the highest row of said first column containing an ancestor, and then generates a descendant for the ancestor below that particular ancestor.

22. A modem according to claim 21, wherein:

said means for deterministically assigning descendant "ones" switches from generating descendants in said top-down manner to generating descendants in a bottom-up manner if said means for preventing would otherwise prevent a descendant from being located in any location due to a rectangle pattern of "ones" appearing in said H matrix.

23. A modem according to claim 22, wherein:

said means for deterministically assigning descendant "ones" generates an ancestor-less descendant in a column adjacent a column where a descendant disappears because it cannot be located by said means for deterministically assigning descendant "ones" because of said means for preventing.

24. A modem according to claim 1, wherein:
said transmitter further includes a scrambler coupled to said digital interface and to said LDPC encoder 54, a mapper coupled to said LDPC encoder, a digital to analog converter coupled to said mapper, and a hybrid coupled to said digital to analog converter.

25. A modem according to claim 24, further comprising:
said receiver includes a demapper coupled to said hybrid, wherein said LDPC decoder is coupled to said demapper.

26. A modem according to claim 24, wherein:
said H matrix is defined by H=A|B, with A being a square matrix and B being a remaining matrix rectangle, and
said generation matrix is defined by G=A$^{-1}$B, where A$^{-1}$ is an inverse of said square matrix A.

27. A modem according to claim 26, wherein:
said LDPC encoder uses said generation matrix and a block of bits received from said scrambler to generate a set of parity bits.

28. A method, comprising:
a) generating an H matrix for low density parity check code by
  1) assigning a plurality of "ones" into a first column of an H matrix having a plurality of columns ($M_k$) and a plurality of rows ($M_j$);
  2) based on the assignment of "ones" in said first column, deterministically assigning descendant "ones" in adjacent columns in a substantially diagonal fashion; and
  3) preventing "ones" from being located in locations which would cause a rectangle pattern of "ones" in said H matrix by causing a descendant "one" which would otherwise be located in one of said locations to assume another location, said preventing thereby causing breaks in diagonal patterns of "ones";
b) generating an encoded data stream based upon said H matrix; and
c) outputting said encoded data stream for transmission over a channel.

29. A method according to claim 28, wherein:
said first column of the H matrix is a left-most column of said matrix.

30. A method according to claim 28, wherein:
said adjacent columns are subsequent columns.

31. A method according to claim 28, wherein:
said assigning "ones" into said first column comprises assigning said "ones" into said first column in a random fashion.

32. A method according to claim 28, wherein:
said assigning "ones" into said first column comprises assigning said "ones" into said first column in a deterministic fashion.

33. A method according to claim 28, wherein:
said assigning "ones" into said first column comprises assigning said "ones" such that said "ones" are distributed evenly within said first column.

34. A method according to claim 28, wherein:
said assigning "ones" into said first column comprises assigning said "ones" according to $$H(r,1)=1, \text{ where } r=1+(i-1)*\text{integer } (M_j/N_j); i=1,2,\ldots N_j$$

where $M_j$ is the number of rows in said H matrix, and $N_j$ is the number of "ones" in a column of said H matrix.

35. A method according to claim 28, wherein:
said assigning descendant "ones" in adjacent columns comprises locating a descendant one position below an ancestor unless locating said descendant in that position which would cause a rectangle pattern of "ones" in said H matrix.

36. A method according to claim 35, wherein:
when an ancestor in a particular column is located at a last row of said H matrix, said assigning descendant "ones" comprises locating a descendant for that ancestor in any row of the next column which would not cause a rectangle pattern of "ones" in said H matrix.

37. A method according to claim 36, wherein:
said any row of the next column is the highest row possible without causing a rectangle pattern of "ones" in said H matrix.

38. A method according to claim 28, wherein:
said assigning descendant "ones" in adjacent columns comprises locating a descendant one position above an ancestor unless locating said descendant in that position which would cause a rectangle pattern of "ones" in said H matrix.

39. A method according to claim 38, wherein:
when an ancestor in a particular column is located at a first row of said H matrix, said assigning descendant "ones" comprises locating a descendant for that ancestor in any row of the next column which would not cause a rectangle pattern of "ones" in said H matrix.

40. A method according to claim 28, wherein:
said preventing "ones" from being located in locations which would cause a rectangle pattern of "ones" in said H matrix comprises shifting the location of a "one" by one position at a time until the descendant is in a position where no rectangle is generated.

41. A method according to claim 40, wherein:
said preventing comprises shifting the location down by one position at a time.

42. A method according to claim 41, wherein:
if a lowest row is reached and still does not present a suitable location for the descendant, said preventing comprises shifting the location up by one position at a time.

43. A method according to claim 40, wherein:
said preventing comprises shifting the location up by one position at a time.

44. A method according to claim 43, wherein:
if a highest row is reached and still does not present a suitable location for the descendant, said preventing comprises shifting the location down by one position at a time.

45. A method according to claim 28, wherein:
said deterministically assigning descendant "ones" in adjacent columns in a substantially diagonal fashion comprises generating descendants in a bottom-up manner such that a descendant is first generated for a descendant for a particular ancestor located in the lowest row of said first column containing an ancestor, and then a descendant is generated for the ancestor above that particular ancestor.

46. A method according to claim 45, wherein:
said deterministically assigning descendant "ones" switches from generating descendants in said bottom-up manner to generating descendants in a top-down manner if said preventing would otherwise prevent a descendant from being located in any location due to a rectangle pattern of "ones" appearing in said H matrix.

47. A method according to claim 46, wherein:

said deterministically assigning descendant "ones" generates an ancestor-less descendant in a column adjacent a column where a descendant disappears because it cannot be located at all because of said preventing.

48. A method according to claim 28, wherein:

said deterministically assigning descendant "ones" in adjacent columns in a substantially diagonal fashion comprises generating descendants in a top-down manner such that a descendant "one" is first generated for a descendant for a particular ancestor located in the highest row of said first column containing an ancestor, and then a descendant is generated for the ancestor below that particular ancestor.

49. A method according to claim 48, wherein:

said deterministically assigning descendant "ones" switches from generating descendants in said top-down manner to generating descendants in a bottom-up manner if said preventing would otherwise prevent a descendant from being located in any location due to a rectangle pattern of "ones" appearing in said H matrix.

50. A method according to claim 49, wherein:

said deterministically assigning descendant "ones" generates an ancestor-less descendant in a column adjacent a column where a descendant disappears because it cannot be located at all because of said preventing.

* * * * *